(12) United States Patent
Nicholls et al.

(10) Patent No.: US 8,598,925 B1
(45) Date of Patent: Dec. 3, 2013

(54) FREQUENCY DETERMINATION CIRCUIT AND METHOD

(75) Inventors: Charles William Tremlett Nicholls, Nepean (CA); Walid Hamdane, Ottawa (CA)

(73) Assignee: Nanowave Technologies Inc., Etobicoke, Ontario (CA)

( * ) Notice: Subject to any disclaimer, the term of this patent is extended or adjusted under 35 U.S.C. 154(b) by 0 days.

(21) Appl. No.: 13/549,708

(22) Filed: Jul. 16, 2012

(51) Int. Cl.
*H03L 7/06* (2006.01)

(52) U.S. Cl.
USPC ............ 327/156; 327/149; 327/158; 327/161

(58) Field of Classification Search
USPC .............. 327/141, 144–163; 331/1 A, 15–17; 375/373–376
See application file for complete search history.

(56) References Cited

U.S. PATENT DOCUMENTS

| | | | | |
|---|---|---|---|---|
| 5,448,763 | A * | 9/1995 | Gillig .............................. | 455/76 |
| 6,057,739 | A * | 5/2000 | Crowley et al. ................. | 331/14 |
| 6,370,360 | B1 * | 4/2002 | Kunkel ........................... | 455/76 |
| 6,552,204 | B1 * | 4/2003 | Harrington et al. ........... | 549/292 |
| 6,680,632 | B1 * | 1/2004 | Meyers et al. ................. | 327/155 |
| 6,842,049 | B2 | 1/2005 | Totsuka | |
| 6,859,509 | B1 | 2/2005 | Koudelka | |
| 7,054,403 | B2 * | 5/2006 | Nosaka et al. ................. | 375/376 |
| 8,207,794 | B2 | 6/2012 | Lee et al. | |
| 2003/0112915 | A1 * | 6/2003 | Meltzer ......................... | 375/376 |
| 2006/0067454 | A1 | 3/2006 | Camuffo | |
| 2008/0315926 | A1 * | 12/2008 | Yoo ............................... | 327/157 |
| 2009/0284318 | A1 * | 11/2009 | Machado ....................... | 331/16 |
| 2009/0309665 | A1 | 12/2009 | Chenakin | |
| 2010/0052752 | A1 * | 3/2010 | Lee et al. ....................... | 327/159 |
| 2010/0321074 | A1 * | 12/2010 | Song .............................. | 327/157 |
| 2011/0273210 | A1 * | 11/2011 | Nagaraj ......................... | 327/159 |
| 2012/0112806 | A1 * | 5/2012 | Dayi .............................. | 327/145 |

OTHER PUBLICATIONS

Hafez et al., "A Novel Low Power Low Phase-Noise PLL Architecture for Wireless Transceivers", Proceeding GLS '99 Proceedings of the Ninth Great Lakes Symposium on VLSI, IEEE Computer Society Washington, DC, USA © 1999, 4 pages.
Yongke, "The Design of Wide BW Frequency Synthesizer Based on the DDS&PLL Hybrid Method", The Ninth International Conference on Electronic Measurement & Instruments, ICEMI Aug. 16-19, 2009, pp. 2-689-2-692.
Bonfanti et al., "A DDS-Based PLL for 2.4-GHz Frequency Synthesis", IEEE Transactions on Circuits and Systems—II: Analog and Digital Signal Processing, vol. 50, No. 12, Dec. 2003, pp. 1007-1010.
International Patent Application No. PCT/CA2013/050524, International Search Report dated Sep. 18, 2013.

* cited by examiner

*Primary Examiner* — Lincoln Donovan
*Assistant Examiner* — Brandon S Cole
(74) *Attorney, Agent, or Firm* — Alexander Anishchenko; Borden Ladner Gervais LLP

(57) ABSTRACT

Circuits and methods for identifying or verifying frequencies are disclosed herein. A frequency verification circuit comprises: an input port for receiving an input signal; a phase frequency difference detector for determining a difference in phase and frequency between the input signal and a feedback signal and for providing a control signal based on the detected difference; a voltage controlled crystal oscillator for producing an output signal based on the control signal; and a feedback loop including a feedback divider for frequency dividing the output signal by a factor R to produce the feedback signal, the feedback divider being programmable to a plurality of values of the factor R to correspond to a plurality of different test frequencies.

12 Claims, 6 Drawing Sheets

FREQUENCY DETERMINATION CIRCUIT AND METHOD

FIELD

The present disclosure relates generally to circuits and methods for determining a frequency component of an electromagnetic signal.

BACKGROUND

Electromagnetic radiation, such as microwave signals, is used in a variety of applications such as telecommunications and RADAR to name but a few. It is often useful to be able to identify a frequency component of a signal or to verify that a given signal is at a given frequency.

There are a number of known methods for determining a frequency of a signal or analyzing the spectrum of a signal. Many of these methods and systems involve relatively expensive or bulky components.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides a frequency verification circuit comprising: an input port for receiving an input signal; a phase frequency difference detector for determining a difference in phase and frequency between the input signal and a feedback signal and for providing a control signal based on the detected difference; a voltage controlled crystal oscillator for producing an output signal based on the control signal; and a feedback loop including a feedback divider for frequency dividing the output signal by a factor R to produce the feedback signal, the feedback divider being programmable to a plurality of values of the factor R to correspond to a plurality of different test frequencies. In various embodiments, the frequency verification circuit comprises physical hardware components.

In some embodiments, the circuit includes an input divider coupled between the input port and the phase frequency difference detector for frequency dividing the input signal by a factor N, a combination of the values of factors N and R defining a test frequency.

In various embodiments, the input divider is programmable to a plurality of values of factor N.

In some embodiments, the circuit further includes a frequency verification unit for verifying that the input signal is substantially at a respective test frequency based on whether the output signal is within a pre-assigned frequency accuracy range.

In some embodiments, for a given combination of values of N and R, the output signal settles within the pre-assigned frequency accuracy range when the input signal is at a frequency within a range of locking frequencies; and the circuit further includes: a resolution bandwidth control circuit (RBCC) coupled between the phase frequency difference detector and the voltage controlled crystal oscillator for scaling the control signal by a scaling factor and for providing an offset to the control signal to adjust the range of locking frequencies.

In various embodiments, the scaling factor has a magnitude of less than unity to reduce the range of locking frequencies.

In some embodiments, the scaling factor is adjustable for varying the range of locking frequencies.

In some embodiments, the RBCC comprises an operational amplifier circuit having a negative feedback loop.

In various embodiments, the negative feedback loop comprises a digitally controlled potentiometer.

In another aspect, the present disclosure provides a method of identifying one or more frequency components of an input signal, the method comprising: frequency dividing the input signal by a factor N to produce an intermediate signal; determining a difference in phase and frequency difference between the intermediate signal and a feedback signal; controlling a voltage controlled crystal oscillator by providing a control signal based on the detected difference in phase and frequency difference, to produce an output signal, the feedback signal being provided by dividing the output signal by a factor R; modifying a value of N to step through a plurality of frequency ranges; and for each of the plurality of the values of N, modifying the value of R to step through a plurality of frequencies; and for each value of R; monitoring the stability of the output signal; and determining that the input signal includes a frequency component corresponding to a respective combination of values of N and R when the output signal is within a pre-assigned frequency accuracy range.

In some embodiments, the pre-assigned frequency accuracy range corresponds to a locked state in which the phase difference between the intermediate signal and the feedback signal is substantially equal to zero.

In some embodiments, the method further includes generating a lock signal, the lock signal comprising a first logical state, the first logical state indicating the locked state, and a second logical state, the second logical state indicating an unlocked state.

In some embodiments, the method further includes identifying a frequency component of the input signal based on a mathematical combination of a frequency of the crystal oscillator, the value of N, and the value of R when the lock signal is in the lock state.

In some embodiments, for a given combination of values of N and R, the output signal settles within a pre-assigned frequency accuracy range when the input signal is at a frequency within a range of locking frequencies; and the method further includes: scaling the control signal by a scaling factor and providing an offset to the control signal, the scaling factor and offset being selected to adjust the range of locking frequencies.

In another aspect, the present disclosure provides a method of verifying a frequency of an input signal, the method comprising: determining a difference in phase and frequency difference between the input signal and a feedback signal; controlling a voltage controlled crystal oscillator, by providing a control signal based on the detected phase and frequency difference, to produce an output signal, the feedback signal being determined by dividing the output signal by a factor R, the factor R being selected to correspond to a test frequency; monitoring the output signal; and verifying that the frequency of the input signal is substantially at the test frequency if the output signal is within a pre-assigned stability range.

In various embodiments, the method further comprises frequency dividing the input signal by a factor N prior to determining the difference in phase and frequency difference; wherein the values of factors N and R being selected correspond to the test frequency.

In various embodiments, for a given combination of values of N and R, the output signal settles within a pre-assigned stability range when the input signal is at a frequency within a range of locking frequencies; and the method further comprises: scaling the control signal by a scaling factor and providing an offset to the control signal, the scaling factor and offset being selected to adjust the range of locking frequencies.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures, wherein.

DETAILED DESCRIPTION

Figure 1:
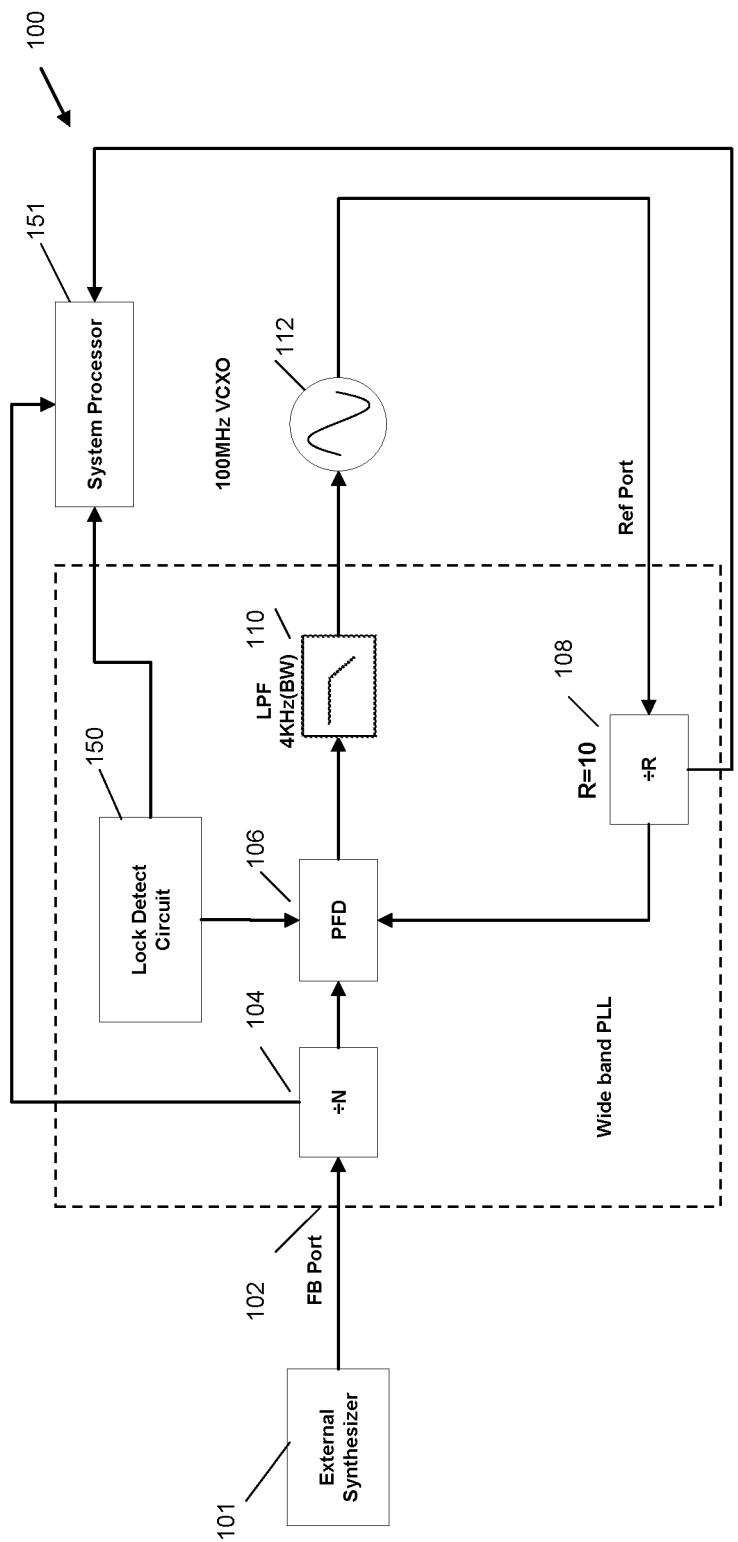
FIG. 1 is a block diagram of a frequency determination circuit in accordance with various embodiments.

Various embodiments disclosed herein relate to systems and methods for identifying a frequency of a signal. Some embodiments disclosed herein can be used to, for example, verify the accuracy of the output frequency of a frequency synthesizer. Frequency synthesizers are used in a variety of applications to produce a signal at a particular frequency. Various of the embodiments disclosed herein can be used to determine whether or not the output of a frequency synthesizer output is at a particular frequency. Some embodiments described herein do not require knowledge of the frequency make up of a signal in order to determine the frequency component(s) of that signal. In other words, some embodiments disclosed herein relate to systems and methods for identifying frequency components of an unknown signal.

Known synthesizer systems currently have no independent onboard frequency determination mechanism to verify the system frequency, apart from a lock detect circuit. A lock detect circuit indicates lock state based on a system reference. In the case that frequency mixing is used at the output of the synthesizer to synthesize frequencies based on the upper and lower side bands of the mixer output a switched filter bank may be used to select the required sideband. In the case that the incorrect sideband is selected, the lock detect of the synthesizer will remain valid whilst the synthesizer output is at the incorrect set frequency consequently the synthesizer lock detect does not reflect the actual output frequency of the system. In general, any frequency synthesizer systems incorporating frequency mixers in combination with phase locked oscillators to generate the output frequency can exhibit a different output frequency than the phase locked oscillators and as such invalidate the lock detect of the individual phase locked oscillators as an unambiguous determination that the correct system output frequency has been achieved. Accordingly, known systems, such as those utilizing frequency mixing architectures, suffer from an ambiguity in the lock detect circuit. For these reasons, known systems are often not able to determine directly the output frequency of the system.

Various embodiments described herein can determine that the correct system output frequency has been achieved. In some embodiments, this allows for a relatively accurate determination of signals compared to known systems and methods. Some embodiments described herein are directed to an independent frequency determination circuit.

Some of the embodiments described herein enable independent low cost frequency determination in an analogous manner to the detection of power by an onboard power detector.

Various embodiments described herein, when coupled with a power detector, can be used as a low cost spectrum analyzer of wide bandwidth.

Various embodiments described herein can be used for a variety of applications, including but not limited to, in RADAR and telecommunication systems for independent frequency verification of internal system frequency references. Other applications include but are not limited to identifying occupied frequency bands so that transmission frequencies may be set to avoid the occupied frequency bands and identifying jamming signals for the purpose of transceiver reconfiguration for reduced jamming signal susceptibility.

Some embodiments described herein have been implemented in test hardware and validation measurements have been performed. Some of the results of these measurements are included within this disclosure.

Reference is first made to FIG. 1, which is a block diagram of a frequency determination circuit 100, according to various embodiments. Frequency determination circuit 100 receives an input signal at an input port 102. The signal can, for example, originate from a source such as external synthesizer 101. The input signal can have an unknown frequency component. In some embodiments, the input signal is referred to as a reference signal and it is the signal that is to be determined by frequency determination circuit 100. The reference signal can be at any frequency higher than the comparison frequency of the phase locked loop and lower than the maximum operating frequency of the frequency dividers used to divide the reference signal down to the comparison frequency.

The input signal is then divided by input divider 104 by a factor N. Phase difference detector 106 determines a phase difference between the divided input signal outputted by divider 104 and a feedback signal outputted by feedback divider 108, and outputs a signal that is a function of the phase difference. Low pass filter (LPF) 110 filters the output of phase difference detector 106. The low pass filtered signal is provided as a control signal to voltage controlled crystal oscillator 112 to produce a feedback signal. The feedback signal is fed back through divider 108 which frequency divides the feedback signal in the feedback loop by a factor R to produce the input signal to the phase frequency detector 106.

In the case that the oscillator 112 phase locks to the divided input signal the lock detect circuit 150 changes its output logic state signifying a lock. The system processor 151 then determines the input signal frequency based on the input frequency divider value N and the feedback divider value R and the know oscillator frequency. The oscillator is a narrow band device the bandwidth of the oscillator determines the uncertainty in the frequency determination.

In some embodiments, oscillator 112 is a VCXO (voltage controlled crystal oscillator). In some embodiments, oscillator 112 has a 8.2 KHz tuning over 3.3V. This corresponds to a tuning sensitivity of 2.5 kHz/V.

In some embodiments, phase difference detector 106, LPF 110, and feedback divider 108 are implemented as utilizing a synthesizer integrated circuit. In various embodiments, one or both of dividers 104 and 108 is/are programmable to provide various values of frequency division.

Some embodiments disclosed herein utilize a conventional phase locked loop (PLL). In various embodiments, the loop formed by phase difference detector 106, LPF 110, oscillator 112, power splitter 114, and feedback divider 108 is a PLL. The comparison frequency, which is the frequency at which the reference and feedback signals are compared, is determined in part by the value of R. Accordingly, adjusting R will adjust the frequency at which the PLL locks. In various embodiments, the PLL is used to lock in phase a stable voltage controlled crystal oscillator.

The resolution bandwidth (RBW) of a detection circuit refers to the range of input frequencies within which the detection circuit will identify the input as being accurate. For example, a resolution bandwidth of 800 kHz at 1 GHz means that circuit will identify any frequency in the range of 0.96 GHz to 1.04 GHz (or 1 GHz±400 KHz) as being an accurate 1 GHz signal. In various embodiments of circuit 100, the resolution bandwidth is the bandwidth in which the PLL will produce a locked state. The resolution bandwidth varies for different input frequencies. The resolution bandwidth also depends on the tuning bandwidth of the oscillator. In general, the use of a higher stability oscillator in the circuit loop will result in a reduced resolution bandwidth and a more accurate frequency determination.

The relationship between fluctuation in the output signal as a function of the fluctuation of input signal can be expressed by the equation:

$$\Delta f_{xtal} = \Delta f_{in}\left(\frac{R}{N}\right),$$

where $\Delta f_{xtal}$ is the fluctuation in the output signal frequency and $\Delta f_{in}$ is the fluctuation in the input signal frequency. For example, in the case where the oscillator is a 1 GHz oscillator that has a tuning range of 600 KHz, and the comparison frequency of the frequency determination circuit is set to 10 MHz, N=100 and R=100, a 1 GHz input signal can be determined with a 600 KHz resolution bandwidth. Similarly, a 10 GHz with N=1000, R=100 will have a resolution bandwidth of 6 MHz.

Table 1 provides the RBW for a 100 MHz oscillator with an 8 KHz tuning bandwidth for various values of input frequencies.

TABLE 1

| $F_{in}$ (MHz) | R/N ratio | $\Delta f_{in}$ Max |
|---|---|---|
| 10000 | 10/1000 = $10^{-2}$ | 800 KHz |
| 5000 | 10/500 = 0.02 | 400 KHz |
| 2500 | 10/250 = 0.04 | 200 KHz |
| 1250 | 10/125 = 0.08 | 100 KHz |
| 1000 | 10/100 = 0.1 | 80 KHz |

As shown in Table 1, the circuit will declare that the external synthesizer frequency is 10 GHz for any actual frequency between 10 GHz±400 KHz, which corresponds to a resolution bandwidth of 800 KHz. Similarly, the RBW is 80 KHz at 1 GHz and the resolution bandwidth is 200 KHz at 2.5 GHz.

Fixing R will fix the comparison frequency of the PLL and the N value for a given value of the frequency of the input frequency ($F_{in}$). In various embodiments, decreasing or increasing R will not have any effect on the $$\Delta f_{xtal} = \Delta f_{in}\left(\frac{R}{N}\right)$$

relationship. Indeed, for some embodiments, the R/N ratio is interdependent and will be auto-adjusted in the case R or N are changed. The R/N ratio is constant for a given value of $F_{in}$ and a given stable oscillator value.

Figure 2:
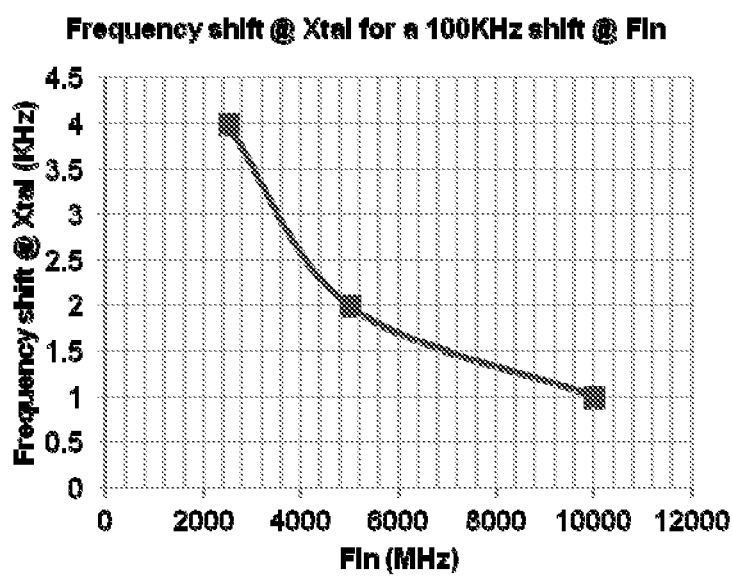
FIG. 2 illustrates a graph of the frequency variation of the output signal of the circuit of FIG. 1 corresponding to a 100 kHz variation of the input signal over a wide range of input frequencies.

In various embodiments, the frequency tuning relationship will decrease as $F_{in}$ increases because of the increase of N. Reference is now made to FIG. 2, which illustrates a graph of the frequency variation relationship between a 100 MHz crystal oscillator (XO) and a wide range of input frequencies for a 100 KHz variation of $F_{in}$. As can bee seen from the graph, for an input signal at 10 GHz ($F_{in}$=10 GHz), a 100 KHz frequency shift in the input signal will shift the frequency of the output signal of the crystal oscillator by 1 KHz. In contrast, for $F_{in}$=2.5 GHz, the same frequency shift on $F_{in}$ will shift the output frequency by 4 KHz. Hence, at $F_{in}$=10 GHz, a 800 KHz frequency variation will cover the entire 8 KHz frequency tuning of the Crystal Oscillator. Outside that region, the frequency detection circuit will declare the input signal as not being a 10 GHz signal. In some embodiments, this is accomplished by the circuit declaring the system unlocked. In other words, the PLL does not achieve a locked state. For $F_{in}$=2.5 GHz only 200 KHz variation on $F_{in}$ will cover the 8 KHz tuning range of the crystal oscillator. Accordingly, in some embodiments, the frequency detection circuit will be "four times more accurate" at 2.5 GHz than at 10 GHz.

Figure 3:
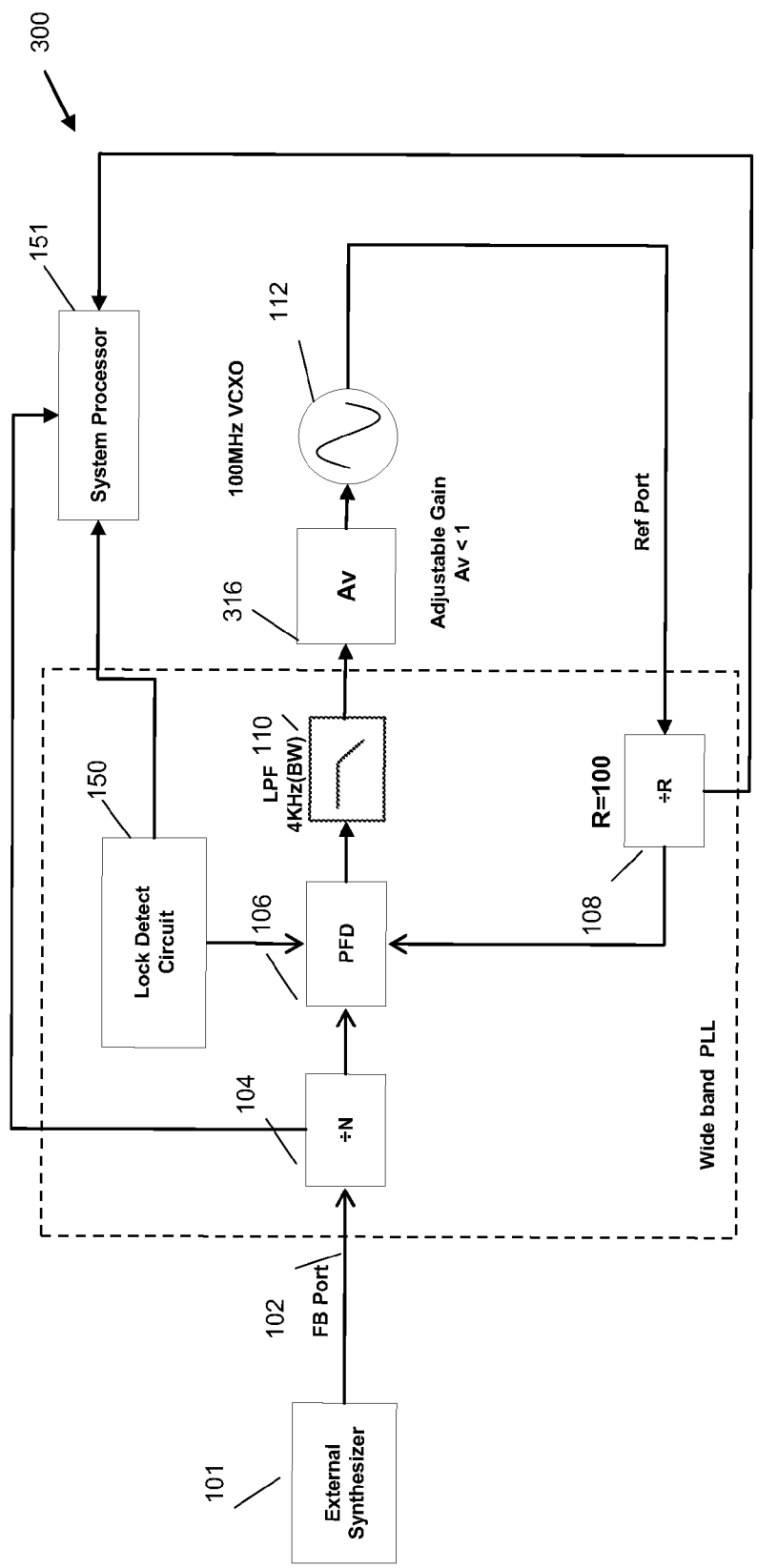
FIG. 3 is a block diagram of a frequency determination circuit in accordance with various embodiments.

Reference is next made to FIG. 3, which is a block diagram of a frequency determination circuit 300, according to various embodiments. Circuit 300 includes some components that are similar to those of circuit 100. These components are numbered similarly and will not be described a second time. Circuit 300 includes a resolution bandwidth control circuit (RBCC) 316 for processing the low pass filtered signal outputted by LPF 110 to produce a control signal applied to the input of oscillator 112. In various embodiments, RBCC 316 processes the output of LPF 110 to create a control signal that enables control of the effective resolution bandwidth of the detector circuit. In some embodiments, RBCC 316 is an amplifier circuit. In some embodiments, the gain of the amplifier circuit is less than 1. In various embodiments, the gain of amplifier 316 is adjustable.

Figure 4:
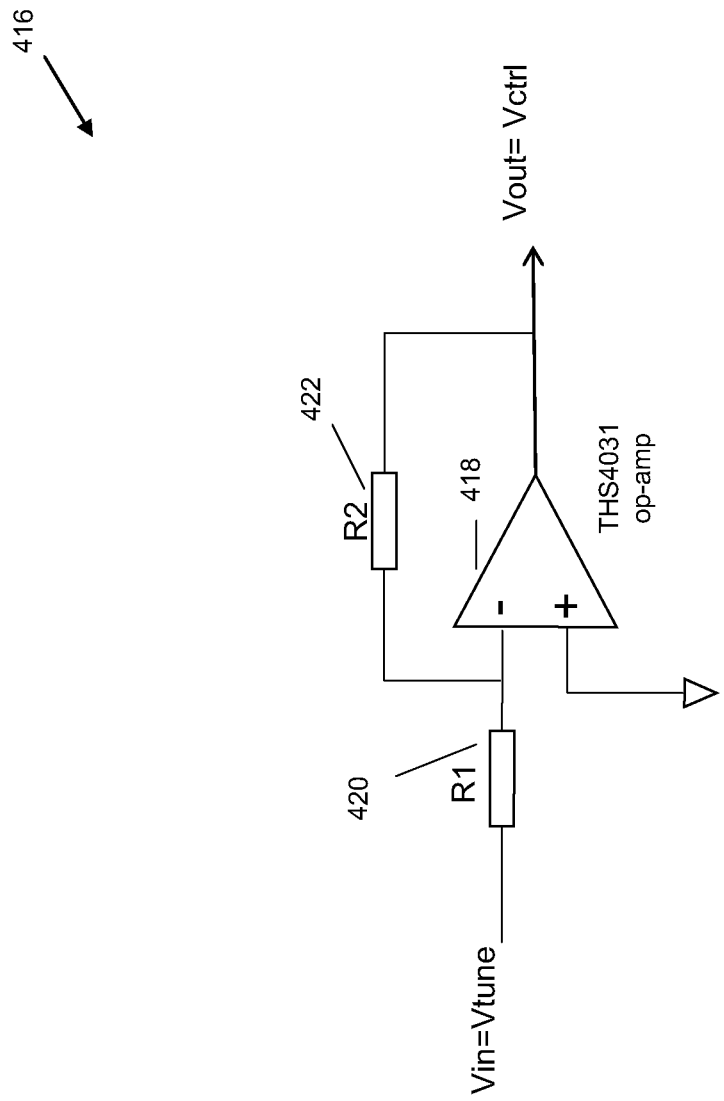
FIG. 4 is a schematic diagram of a resolution bandwidth control circuit in accordance with various embodiments.

Reference is next made to FIG. 4, which is a schematic diagram of RBCC 416, which in some embodiments, is used to implement RBCC 316 of FIG. 3. In some embodiments, circuit 416 is implemented as an inverting operational amplifier circuit including an operational amplifier 418, a first resistor 420, and a second resistor 422 connecting in an inverting configuration. Specifically, resistor 420 is coupled between the output of LPF 110 and inverting node of amplifier 418. Resistor 406 is coupled between the inverting node and output of amplifier 420. The gain of the amplifier circuit is given as $A_v$=R1/R2, where R1 is the resistance of resistor 404 and R2 is the resistance of resistor 422.

The use of such an amplifier circuit allows for a decrease in the RBW of the frequency detector circuit. In various embodiments, the gain of the amplifier is set to a value K that less than unity and is placed between the output port of LPF 110 and the control pin of the VCXO. Circuit 416 limits the swing of the output voltage of the LPF 110 by a factor of 1/k. and hence proportionally reduces the tuning range of VCXO 112.

By fixing the resistance (R1) of resistor 420, the gain ($A_v=R_2/R_1$) of the circuit of FIG. 4 is adjusted by adjusting the resistance (R2) of resistor 422. The inventors tested the circuit 300 with using the circuit 416 of FIG. 4 for 316 using different gains. Specifically, three different Gains were tested, $A_v=1$, $A_v=0.1$ and $A_v=0.01$ Table 2 below illustrates the frequency range for which the PLL declares Lock for an input RF frequency $F_{in}$ of 1 GHz and 10 GHz. In various embodiments, the lock is declared when the phase difference detected by phase difference detector 106 drops to a value substantially equal to 0. As expected, the RBW is decreased as the gain of the amplifier decreases. As an example, for Fin=1 GHz, the RBW goes from 80 KHz for $A_v=1$ to around 1.5 KHz for $A_v=0.01$. In this particular implementation, the RBW improvement is not perfectly a 100 times. However it is sufficient enough to show the interest of using the op-amp circuit. Moreover, the RBW is 10 times higher at 10 GHz, which is expected as N is 10 times higher. The inventors found this to be true for all tested $A_v$.

|  | Lock Range | |
| --- | --- | --- |
|  | 1 GHz | 10 GHz |
| Amplifier Gain: $A_v=1$ | 999.95 To 1000.03 MHz RBW: 8 KHz | 9999.5 To 10000.3 RBW: 800 KHz |
| Amplifier Gain: $A_v=0.1$ | 1000.041 To 1000.054 RBW: 1.3 KHz | 10000.41 To 10000.54 RBW: 130 KHz |
| Amplifier Gain: $A_v=0.01$ | 1000.0397 To 1000.0412 RBW: 0.15 KHz | 10000.395 To 10000.411 RBW: 1.6 KHz |

In summary, in some embodiments where 316 comprises a op-amp circuit as illustrated in FIG. 4, the resolution bandwidth can be set through control of the feedback resistor (406) of a loop amplifier. In some embodiments, the feedback resistor (406) is a digital potentiometer and this can enable the system to maintain the same resolution bandwidth for any frequency.

Reference is next made to FIG. 5A which is a block diagram of a frequency determination circuit 500, according to various embodiments. Circuit 500 includes some components that are similar to those of circuits 100 and 300. These components are numbered similarly. Circuit 500 includes a resolution bandwidth control circuit (RBCC) 516 for processing the low pass filtered signal outputted by LPF 110 to produce a control signal to be applied to the input of oscillator 512. In some embodiments, oscillator 512 is a VCSO (voltage controlled saw oscillator) with a 120 kHz/v tuning sensitivity. In other embodiments, other oscillators are utilized.

In various embodiments, RBCC 516 includes an operational amplifier 518, a first resistor 520, a second resistor 522, and a Digital to Analog Converter (DAC) 524, and a third resistor 526. In some embodiments, resistor 522 is a digitally controller potentiometer. The resolution bandwidth of circuit 500 can be adjusted by adjusting the value of the resistance of resistor 522. In various embodiments, the gain of RBCC 516, which is given by the equation $A_v=-R_{f1}/R_1$ (where $R_f$ is the resistance of resistor 522 and $R_1$ is the resistance of resistor 520) is selected to have a magnitude of less than unity in order to reduce the lock range of circuit 500.

DAC 524 is used to set an offset voltage based on a digital command. The offset voltage is applied to the non-inverting node of op-amp 518 and is transferred to the output node of op-amp 518. Accordingly, circuit 516 both scales and provides a DC offset to the signal outputted by LPF 108. In various embodiments, the voltage offset is used to center the lock voltage range. As an illustration, consider an example in which the control voltage range for the VCO is 5V and it is scaled by a factor of 0.5. The tuning voltage range will be skewed to the range 0 to 2.5V. By setting the offset voltage to the mid range of the VCO tuning range avoids scaling of the control range resulting in the tuning voltage applied to the VCO being close to zero where fluctuations in the input signal frequency will cause the VCO to unlock. The DC offset voltage is consequently selected to be the mid range voltage of the VCO tuning characteristic. In the latter example the DC offset voltage would be 2.5V.

In various embodiments, circuit 500 includes a power detector 530 coupled between the external signal source and the first divider 104.

In various embodiments, circuit 500 includes a third divider 532. Divider 532 is included in the feedback loop and is coupled between power splitter 114 and divider 108. In various embodiments, this third divider 532 provides additional frequency division beyond that present in the PLL integrated circuit. In addition the external frequency divider is selected to ensure that the input frequency bandwidth requirements of the PLL integrated circuit are met. If for example the integrated circuit can accept a maximum frequency of 6 GHz but the narrow band oscillator is operating at 8 GHz as would be the case if a DRO were used as the fixed frequency reference signal then a wide band frequency divider would be used to bring the DRO frequency down from say 8 GHz to 4 GHz which would then be within the bandwidth of the PLL.

Reference is now made to FIG. 5B, which illustrates the reduction in tuning range resulting from RBCC 516. FIG. 5B shows the voltage swing at two different nodes of circuit 500. The line 552 illustrates the voltage swing at the output of LPF 112. The line 554 represents the voltage swing that would occur if the output of LPF 112 were only scaled. If a voltage offset (represented by the line 556) is applied as well, the resulting voltage swing that occurs can be represented by the line 558.

Figure 6:
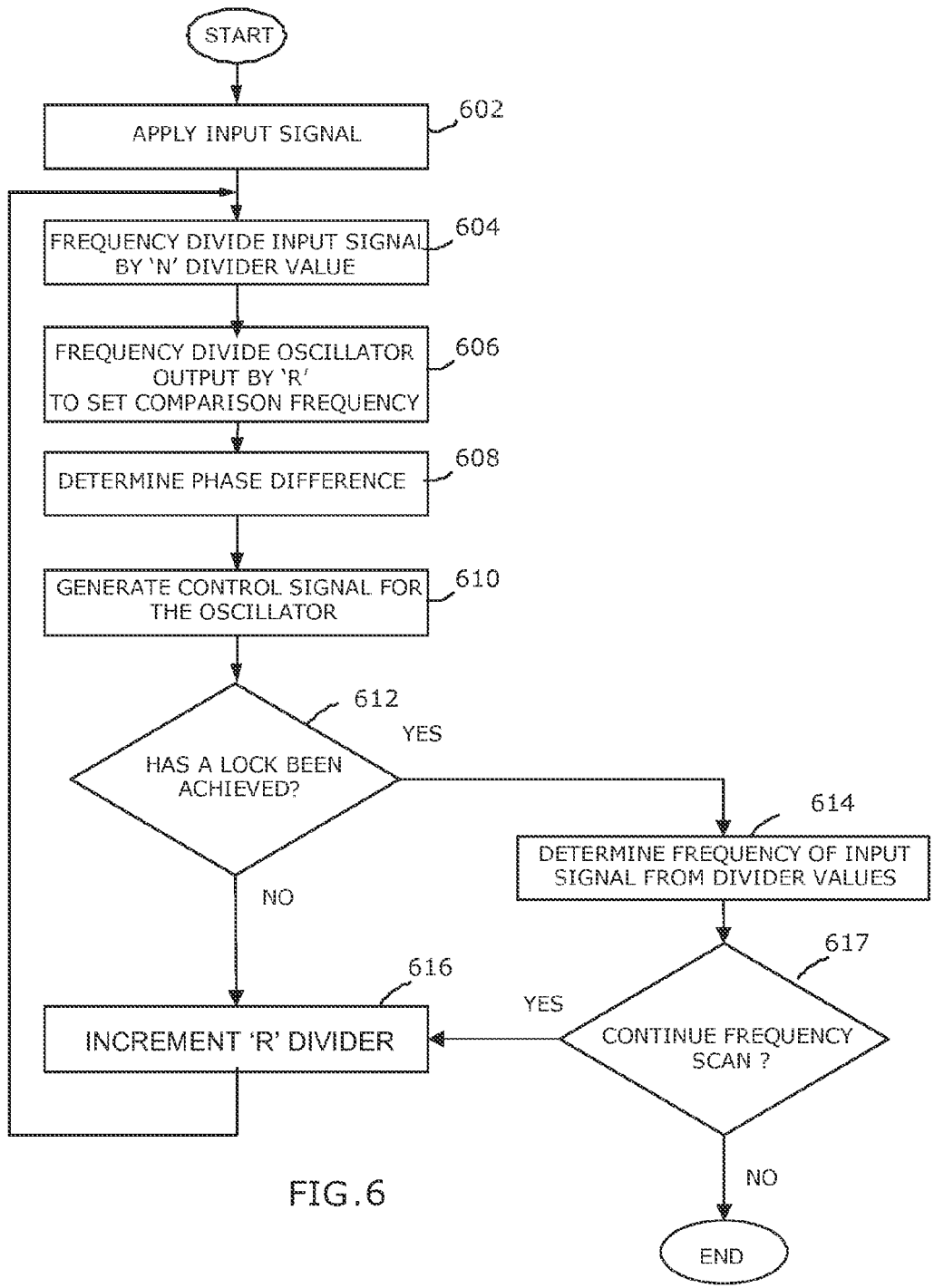
FIG. 6 is a flowchart illustrating an example of a method of frequency determination in accordance with various embodiments.

Reference is next made to FIG. 6, which is a flow chart illustrating an example of a method of operating a system including a frequency determination circuit, such as circuit 100. The method may be carried out by software executed by, for example, a processor. Coding of software for carrying out such a method is within the scope of a person of ordinary skill in the art given the present description. The method may contain additional or fewer processes than shown and/or described, and may be performed in a different order. Computer-readable code executable by at least one controller or processor, such as for example processor 151 or a different processor, to perform the method may be stored in a computer-readable medium, such as a non-transitory computer-readable medium.

At 602, an input signal is applied to the input port of the frequency determination circuit. In some embodiments, the frequency determination circuit may be incorporated as part of a system that also includes a frequency synthesizer. In such embodiments, the input signal can be the output of the frequency synthesizer. The frequency determination circuit may be used by the system as an onboard frequency test for a frequency synthesizer. In such embodiments, 602 may include issuing a command to set the frequency synthesizer to a specified output frequency.

At 604 the input signal is divided down in frequency in accordance with the setting of the programmable divider (e.g. divider 104) to the comparison frequency of the frequency determination circuit PLL.

At 606, the output of a voltage controlled oscillator (e.g. oscillator 112) is divided by the feedback divider (e.g. divider 108) of the loop to the comparison frequency.

At 608, a phase and frequency difference is determined between the divided down input signal generated at 604 and the output of the feedback divider is determined.

At 610, a control signal for the voltage controlled oscillator is generated based on the phase and frequency difference detected at 608.

At 612, a determination is made as to whether a lock state has been achieved by the PLL of the frequency determination circuit. In some embodiments, this occurs when the phase error detected by phase detector 106 drops to a value of 0 or substantially 0. In some embodiments, the system includes a lock detect flag. The lock detect flag goes high when the PLL achieves a lock state and remains low when the PLL is not in a lock state. Lock detect is achieved by monitoring the output of the phase frequency detector. Under locked conditions the AC signal output of the phase frequency detector drops substantially to zero, in the unlocked state the AC signal output of the phase frequency detector contains a DC offset which can be used to determine the unlocked condition of the phase locked loop. The lock detect function is a standard capability of modern synthesizer integrated circuits and can be implemented in a number of different ways, the method presented is only an example.

When a lock state is achieved, a frequency component of the input signal can be determined at 614 from multiplication of the comparison frequency by the N divider present in the reference path. The comparison frequency is calculated from the stable reference oscillator frequency divided by the feedback loop R divider.

If a lock state is not achieved, then at 616 the value of divider 108 can be changed and the process repeated. Alternatively, the process can end and a determination made that the signal source does not include a frequency component corresponding to the current setting of the divider values.

At 618, a determination can be made to continue the process or to end the process. In various embodiments, the process is continued even after a frequency component has been identified at 614. This can be used to, for example, perform a band scan and identify a number of frequency components in the scanned band of frequencies. If the decision is made not to continue, then the process is terminated after 618. If the determination is made to continue, then 616 is repeated.

By the method of FIG. 6, some of the embodiments disclosed herein provide a way to independently verify the frequency of the input signal applied to the input of the frequency determination signal to an accuracy defined by the lock range of the invention frequency synthesizer. In addition, various of the embodiments described herein can be used to identify frequency components of an input signal, without any prior knowledge of the actual or expected frequency composition of input signal. Use of a high stability crystal reference in the invention control loop can reduce the frequency determination uncertainty to the KHz range.

As discussed above in relation to FIGS. 3 and 5 further control of the resolution bandwidth is achieved by placing an inverting amplifier in the control loop which has a gain less than unity. The gain stage results in the tuning range of the voltage controlled crystal oscillator being limited to a fraction of the compliance range of the frequency synthesizer output stage.

Figure 5:
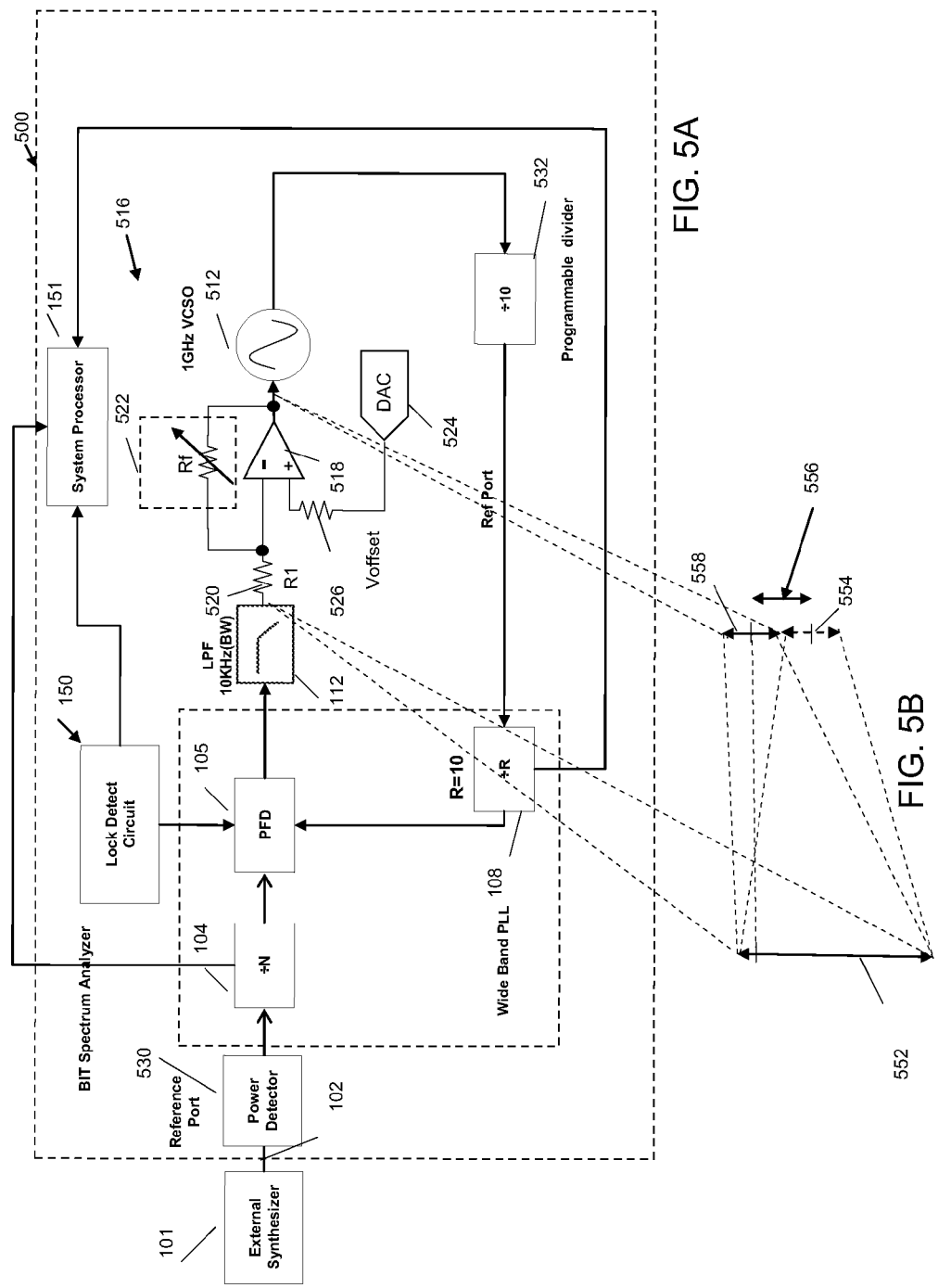
FIG. 5A is a block diagram of a frequency determination circuit in accordance with various embodiments.
FIG. 5B is a schematic diagram of examples of the magnitude of the voltage swing at two of the nodes of the circuit of FIG. 5A.

Monitoring of the RF signal power applied to the input port of the frequency determination circuit enables a power level to be associated with the determined frequency thus enabling full frequency and power spectral analysis of a signal. In some embodiments, the power is monitored by the use of a power detector, such as power detector 530, as illustrated in FIG. 5.

In contrast to known systems, some of the embodiments disclosed herein have an advantage over conventional spectrum analysis approaches in that very few components are required to provide a small form factor spectrum analysis function within a larger system.

Some embodiments of the frequency determination circuits disclosed herein can be used to monitor the output frequency of multiple synthesizers present in a system and provide a determination if each of the frequencies are correct. Such an application could be considered a built in self-test.

Some embodiments disclosed herein can be utilized to scan a wide band of frequencies up to the input bandwidth of the circuit. In some embodiments, the input bandwidth is 14 GHz. However, based on the present disclosure, a person skilled in the art will understand how to increase the input bandwidth of such embodiments beyond 14 GHz. A method of identifying frequencies includes initiating a rapid scan of the band with the resolution bandwidth set to its coarsest setting. Signals detected within the band could then be determined more accurately by setting the resolution bandwidth to a finer setting and sweeping the division ratio N over the narrow range associated with the initial detection frequency. The use of some of the embodiments according to such a method enables wideband spectrum analysis and frequency identification.

The above-discussed method of identifying frequencies can be utilized in the allocation of transmit and receive frequencies to avoid occupied bandwidth. Such frequency agility would readily be implemented by using the division ratio of various embodiments disclosed herein to determine the occupied band(s) and set the transmit and receive system frequencies to avoid the band(s) in question. Such a system and method can be implemented dynamically to ensure maximization of the available bandwidth.

The above-described embodiments are intended to be examples only. Alterations, modifications and variations can be effected to the particular embodiments by those of skill in the art without departing from the scope, which is defined solely by the claims appended hereto.

What is claimed is:

1. A frequency verification circuit comprising:
an input port for receiving an input signal;
a phase frequency difference detector for determining a difference in phase and frequency between the input signal and a feedback signal and for providing a control signal based on the detected difference;
a voltage controlled crystal oscillator for producing an output signal based on the control signal;
a feedback loop including a feedback divider for frequency dividing the output signal by a factor R to produce the feedback signal, the feedback divider being programmable to a plurality of values of the factor R to correspond to a plurality of different test frequencies;
a frequency verification unit for verifying that the input signal is substantially at a respective test frequency based on whether the output signal is within a pre-assigned frequency accuracy range; and
a resolution bandwidth control circuit (RBCC) coupled between the phase frequency difference detector and the voltage controlled crystal oscillator for scaling the control signal by a scaling factor and for providing an offset to the control signal to adjust the range of locking frequencies;

wherein for a given combination of values of N and R, the output signal settles within the pre-assigned frequency accuracy range when the input signal is at a frequency within a range of locking frequencies; and wherein the scaling factor has a magnitude of less than unity to reduce the range of locking frequencies.

2. The circuit of claim 1, further comprising an input divider coupled between the input port and the phase frequency difference detector for frequency dividing the input signal by a factor N, a combination of the values of factors N and R defining a test frequency.

3. The circuit of claim 2, wherein the input divider is programmable to a plurality of values of factor N.

4. The circuit of claim 1, wherein the scaling factor is adjustable for varying the range of locking frequencies.

5. The circuit of claim 1, wherein the RBCC comprises an operational amplifier circuit having a negative feedback loop.

6. The circuit of claim 5, wherein the negative feedback loop comprises a digitally controlled potentiometer.

7. A method of identifying one or more frequency components of an input signal, the method comprising:

frequency dividing the input signal by a factor N to produce an intermediate signal;

determining a difference in phase and frequency between the intermediate signal and a feedback signal;

controlling a voltage controlled crystal oscillator by providing a control signal based on the detected difference in phase and frequency, to produce an output signal, the feed back signal being provided by dividing the output signal by a factor R;

modifying a value of N to step through a plurality of frequency ranges; and for each of the plurality of the values of N, modifying the value of R to step through a plurality of frequencies;

for each value of R;

monitoring the lock status of a phase locked loop and determining that the input signal includes a frequency component corresponding to a respective combination of values of N and R when the output signal is within a pre-assigned frequency accuracy range; and scaling the control signal by a scaling factor and providing an offset to the control signal, the scaling factor and offset being selected to adjust the range of locking frequencies;

wherein for a given combination of values of N and R, the output signal settles within a pre-assigned frequency accuracy range when the input signal is at a frequency within a range of locking frequencies; and wherein the scaling factor has a magnitude of less than unity to reduce the range of locking frequencies.

8. The method of claim 7, wherein the pre-assigned frequency accuracy range corresponds to a locked state in which the phase difference between the intermediate signal and the feedback signal is substantially equal to zero.

9. The method of claim 8, further comprising generating a lock signal, the lock signal comprising a first logical state, the first logical state indicating the locked state, and a second logical state, the second logical state indicating an unlocked state.

10. The method of claim 9, further comprising identifying a frequency component of the input signal based on a mathematical combination of a frequency of the crystal oscillator, the value of N, and the value of R when the lock signal is in the lock state.

11. A method of verifying a frequency of an input signal, the method comprising:

determining a difference in phase and frequency between the input signal and a feedback signal;

controlling a voltage controlled crystal oscillator, by providing a control signal based on the detected phase and frequency difference, to produce an output signal, the feedback signal being determined by dividing the output signal by a factor R, the factor R being selected to correspond to a test frequency;

monitoring the output signal;

verifying that the frequency of the input signal is substantially at the test frequency if the output signal is within a pre-assigned stability range; and scaling the control signal by a scaling factor and providing an offset to the control signal, the scaling factor and offset being selected to adjust the range of locking frequencies;

wherein for a given combination of values of N and R, the output signal settles within a pre-assigned stability range when the input signal is at a frequency within a range of locking frequencies; and wherein the scaling factor has a magnitude of less than unity to reduce the range of locking frequencies.

12. The method of claim 11, further comprising frequency dividing the input signal by a factor N prior to determining the difference in phase and frequency; wherein the values of factors N and R being selected correspond to the test frequency.

* * * * *